(12) United States Patent
Corbett et al.

(10) Patent No.: US 10,107,855 B1
(45) Date of Patent: Oct. 23, 2018

(54) ELECTROMAGNETIC VERIFICATION OF INTEGRATED CIRCUITS

(71) Applicant: Xilinx, Inc., San Jose, CA (US)

(72) Inventors: John D. Corbett, Monte Sereno, CA (US); Steven E. McNeil, Rio Rancho, NM (US)

(73) Assignee: XILINX, INC., San Jose, CA (US)

(*) Notice: Subject to any disclaimer, the term of this patent is extended or adjusted under 35 U.S.C. 154(b) by 805 days.

(21) Appl. No.: 14/536,474

(22) Filed: Nov. 7, 2014

(51) Int. Cl.
*G01R 31/28* (2006.01)

(52) U.S. Cl.
CPC .............. *G01R 31/2851* (2013.01)

(58) Field of Classification Search
None
See application file for complete search history.

(56) References Cited

U.S. PATENT DOCUMENTS

| | | | | |
|---|---|---|---|---|
| 8,239,811 B2* | 8/2012 | Anemikos | ........... | H01L 22/12 716/134 |
| 2006/0227085 A1* | 10/2006 | Boldt, Jr. | ........... | G09G 3/32 345/83 |
| 2010/0287604 A1* | 11/2010 | Potkonjak | ........... | G06F 21/73 726/6 |
| 2012/0215473 A1* | 8/2012 | Regis | ........... | G01R 31/002 702/66 |
| 2013/0141137 A1* | 6/2013 | Krutzik | ........... | H03K 19/173 326/8 |

OTHER PUBLICATIONS

H. Huang, A. Boyer, S. Ben Dhia; "The detection of counterfeit integrated circuit by the use of electromagnetic fingerprint"; Sep. 1-4, 2014; Proc. of the 2014 International Symposium on Electromagnetic Compatibility (EMC Europe 2014); pp. 1118-1122.*
Thompson, Adrian, "Evolving Electronic Robot Controllers that Exploit Hardware Resources CSRP 368", School of Cognitve and Computing Sciences,The Proceedings of the 3$^{rd}$ European Conference on Artificial Life (ECAL95), Springer Verlag, Granada, Spain, Jun. 4-6, 1995, 12 pages.

* cited by examiner

*Primary Examiner* — Reema Patel
*Assistant Examiner* — Steven Christopher
(74) *Attorney, Agent, or Firm* — LeRoy D. Maunu

(57) ABSTRACT

Apparatuses, systems, and methods for detecting changes to an IC are disclosed. In an example implementation, an apparatus includes an electromagnetic (EM) sensor. A high-resolution analog-to-digital converter (ADC) is configured to quantize a segment of the EM signal of an IC measured by the EM sensor. The quantized segment of the EM signal is unique to process-voltage-temperature (PVT) characteristics exhibited by the IC. The apparatus also includes a processing circuit configured to prompt the high-resolution ADC, via a control signal, to produce the quantized segment of the EM signal. The processing circuit determines a first signature from the quantized segment and retrieves a baseline signature corresponding to the IC from a data storage circuit. In response to the first signature being different from the baseline signature, the processing circuit indicates that a change to the IC is detected.

20 Claims, 4 Drawing Sheets

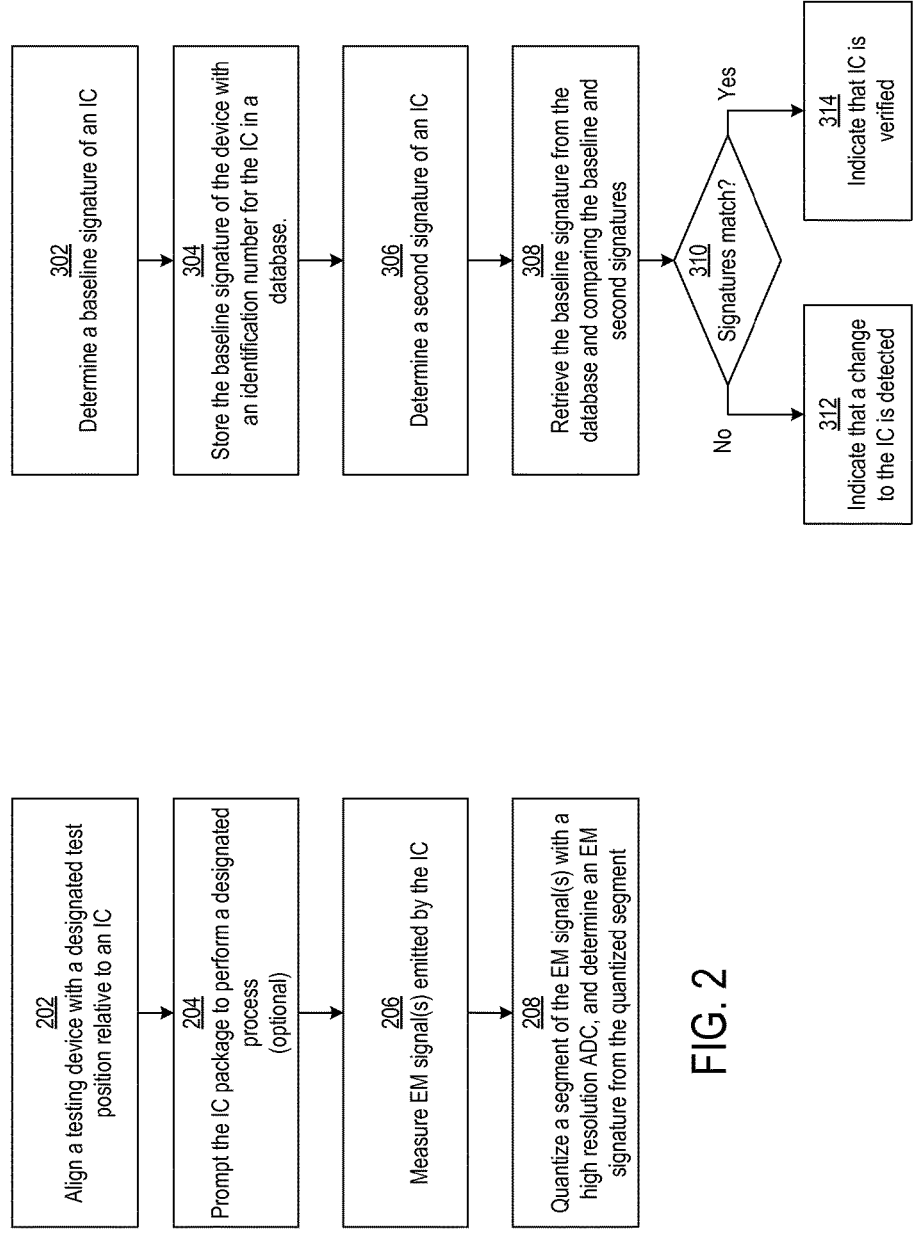

ELECTROMAGNETIC VERIFICATION OF INTEGRATED CIRCUITS

FIELD OF THE INVENTION

The present invention generally relates to detecting changes to an integrated circuit (IC).

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic that may be programmed by loading a set of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The complexity of system designs is increasing along with the additional resources made available with each new generation of PLDs. Early generations of PLDs were popular for glue logic, and recent generations have the resources to implement a system on a chip. In developing a large system having many subcomponents, designers are increasingly relying on designs previously created for the subcomponents. The subcomponent designs may be developed internally by an organization responsible for designing and implementing the overall system, or obtained from outside the organization.

In large systems, subcomponents may be gathered from various sources and assembled by a large number of parties in the manufacturing chain. Accordingly, vendors have less control than if all the subcomponents were designed and created and assembled by a single vendor. Moreover, various subcomponents may be accessed after assembly by various parties responsible for maintenance of the system. Even with trusted vendors, assemblers, and maintenance employees there may be some degree of risk that an unscrupulous person may tamper with components to install unauthorized circuits or logic such as Trojan horse logic. Trojan horse logic may be instantiated and activated after the system is deployed and operating and may expose secret information or modify some function of the design, for example. The risks are relevant to applications ranging from military defense systems to commercial banking systems, for example.

SUMMARY

An apparatus is disclosed for detecting changes to an IC. The apparatus includes an electromagnetic (EM) sensor configured to measure an EM signal emitted by the IC. A high-resolution analog-to-digital converter (ADC) is coupled to the EM sensor and configured to produce a quantized segment of the EM signal in response to a control signal. The quantized segment of the EM signal is unique to process-voltage-temperature (PVT) characteristics exhibited by the IC. The apparatus also includes a data storage circuit and a processing circuit coupled to the high-resolution ADC and the data storage circuit. The processing circuit is configured to perform a set of verification operations. As part of the verification operations, the processing circuit prompts the high-resolution ADC, via the control signal, to produce the quantized segment of the EM signal. The processing circuit also determines a first signature from the quantized segment of the EM signal and retrieves a baseline signature corresponding to the IC from the data storage circuit. In response to the first signature being different from the baseline signature, the processing circuit indicates that a change to the IC is detected.

A method for detecting changes to an IC is also disclosed. A segment of an EM signal emitted by the IC is measured. The segment of the EM signal is quantized using a high-resolution ADC to produce a quantized segment of the EM signal that is unique to the PVT characteristics exhibited by the IC. A first signature is determined from the quantized segment of the EM signal. The baseline signature is retrieved from a database. If the first signature is different from the baseline signature, a change to the IC is detected.

A system is also disclosed. The system includes a database and first and second devices communicatively coupled to the database. The first device is configured to determine a baseline signature for an integrated circuit from an EM signal emitted by the IC. The baseline signature is unique to the PVT characteristics exhibited by the IC. The first device is also configured to upload the baseline signature to the database and associate the baseline signature with an identification number in the database. The second device is configured to determine a second signature for the IC that is also unique to the PVT characteristics exhibited by the IC. The second device retrieves the baseline signature from the database using the identification number of the IC. In response to the second signature being different from the baseline signature, the second device indicates that a change to the IC is detected.

Other features will be recognized from consideration of the Detailed Description and Claims, which follow.

BRIEF DESCRIPTION OF THE DRAWINGS

Various aspects and features of the apparatuses, systems, and methods will become apparent upon review of the following detailed description and upon reference to the drawings in which:

FIG. 2 shows a process for determining a signature of an IC based on EM emissions;

FIG. 3 shows a first process for IC verification, in accordance with one or more implementations;

DETAILED DESCRIPTION OF THE DRAWINGS

Figure 1:
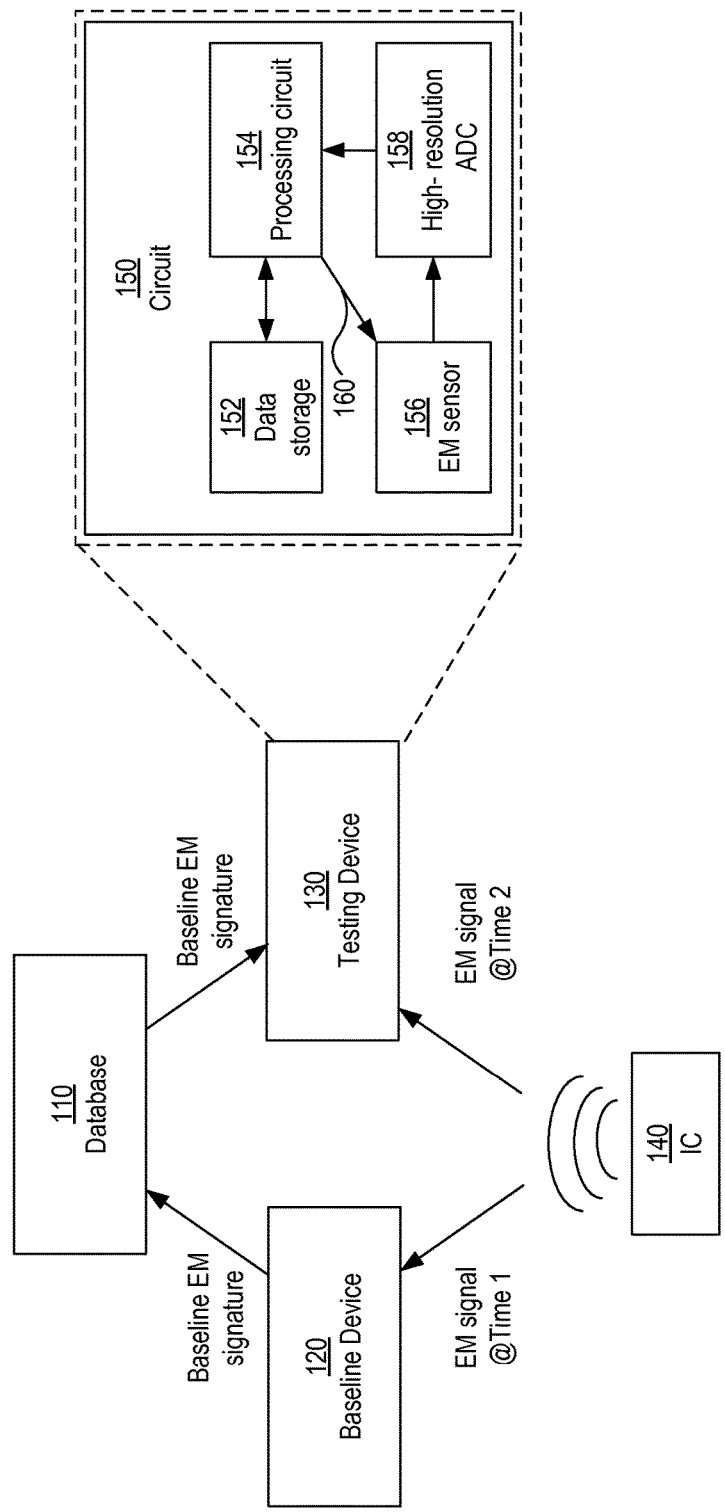
FIG. 1 shows a system for verifying an IC using EM emissions, in accordance with one or more implementations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Circuits, systems, and methods are disclosed for detecting changes to an IC using an EM signal emitted by the IC. Changes may occur, for example, due to tampering of circuitry of the IC or software executed by the IC. Changes may also be caused by stresses on the IC during operation, such as, negative bias temperature instability (NBTI), thermal stresses, vibration, and/or cumulative radiation exposure.

Various implementations determine a signature for an IC based on an EM signal emitted by the IC. The signature is unique to the PVT characteristics exhibited by an IC when the signature is determined. In some implementations, a baseline signature is determined for an IC and stored in a database. If the IC is modified or replaced, different PVT characteristics will be exhibited, thereby changing the EM signal that is emitted by the IC. At a later time, it can be determined whether the device has been modified by determining a new signature based on the current EM signal emitted by the device and comparing the new signature to the baseline signature. If the determined signature for an IC does not match the previously determined baseline signature for the device, a change to the IC is detected.

In some implementations, a device is provided that is configured to determine a signature for an IC based on an EM signal emitted by the IC. The device includes an EM sensor configured to measure the EM signal emitted by the IC. A high-resolution ADC is coupled to the EM sensor and is configured to produce a quantized segment of the EM signal in response to a control signal. The resolution of the ADC is high enough such that the values of the quantized segment are sensitive to PVT characteristics exhibited by the IC. The device includes a processing circuit that prompts the ADC, via the control signal, to produce the quantized signature and determine a signature for the IC from the quantized segment. In some implementations, the processing circuit may perform a statistical analysis to isolate an EM signal emitted by the IC from environmental noise generated by other sources to determine the signature for the IC.

In some implementations, the device is configured to determine baseline signatures for ICs based on EM signals emitted by the ICs, and store the signatures of the ICs in a database. In some other implementations, the device is configured to detect subsequent changes to the IC by determining and comparing a current signature of the IC to the baseline signature stored in the database. In some implementations, the device may be configured to determine baseline signatures in a first mode and test for subsequent changes to the IC in a second mode.

The database may be stored locally in data storage included in the device or may be stored remotely in a file server connected to the device via a network (e.g., a cloud-based file server). In an example implementation, the processing circuit of the device is configured to associate and store an identification number for the IC with the determined signature for the IC in the database. The identification number may be, for example, a serial number provided by a vendor of the IC or system into which the IC is incorporated.

The EM signal of an IC measured by an EM sensor may depend on a number of factors including, for example, processes being performed by the IC, PVT exhibited by the IC, and the orientation of the EM sensor relative to the IC. In some implementations, the device is configured to measure and quantize an EM signal emitted by the IC while performing a designated process, during which the IC will emit an expected EM signal patterns. For instance, the device may be configured to measure and quantize an EM signal emitted during a boot sequence of the IC. In some implementations, the device may be configured to prompt the IC to perform the designated process. For example, the processor of the device may prompt the IC to perform the designated process by transmitting an electronic or a radio-frequency (RF) command signal. As another example, the processor of the device may input a predetermined set of data to the IC to cause the IC to perform the designated process.

As previously indicated, the EM signal emitted by the IC may vary depending on the PVT characteristics of the IC. As such, an IC may emit different EM signal patterns at different operating temperatures. To accommodate different environments, some implementations may determine multiple baseline signatures for a range of possible operating temperatures. When testing an IC for changes, a current signature for the IC may be compared to the baseline signatures for the range of operating temperatures. If the current signature does not match any of the baseline signatures, a change to the IC is detected. Similarly, some implementations may determine a respective signature for each mode of operation in which the IC may emit a different EM pattern. For instance, the device may determine a first signature based on the EM signal emitted during a boot-sequence of the IC, a second signature based on the EM signal emitted during a full-power state of the IC, and a third signature based on the EM signal emitted during a low-power state of the IC.

As previously indicated, the EM signals of an IC that are measured by an EM sensor may also depend on orientation of the EM sensor relative to the IC. In some implementations, the device may include an alignment indicator configured to align with an alignment marker on the IC when the EM sensor is positioned in a designated testing location relative to the IC.

In some applications, a circuit design may be modified prior to implementation, as an application specific IC (ASIC) or using a programmed programmable IC, to increase EM signals emitted by the IC that are dependent on unique characteristics of the IC. For example, a circuit design may be deliberately modified to emit an increased level of EM signals emitted during operation. The modifications may include increasing the length of signal lines, for example. As another example, a circuit design may be modified to include one or more physically unclonable functions (PUFs), whose behavior is dependent on the PVT characteristics exhibited by the IC. A PUF may exhibit, for example, a race condition having an outcome dependent on the PVT characteristics exhibited by the IC.

These and other aspects are described in more detail with reference to the figures in the following discussion. Turning now to the figures, FIG. 1 shows a system for verifying an IC using EM emissions, in accordance with one or more implementations. The system includes a database 110, a baseline device 120 and a testing device 130 communicatively coupled to the database. The baseline device 120 is configured to determine a baseline signature for integrated circuit 140 based on an EM signal emitted by the IC 140 at a first time. The baseline signature is unique to the PVT characteristics exhibited by the IC. The baseline device 120 is also configured to upload the determined baseline signature to the database 110 and associate the baseline signature with an identification number for the IC 140 in the database 110.

The testing device 130 is configured to determine a second signature for the IC 140 that is also unique to the PVT characteristics exhibited by the IC. The testing device 130 retrieves the baseline signature of the IC 140 from the database 110 using the identification number of the IC. In response to the second signature being different from the baseline signature, the testing device 130 indicates that a change to the IC is detected.

The baseline and testing devices 120 and 130 may be handheld devices which may be adapted for various applications. In some applications, baseline and/or testing devices 120 and 130 may be handheld configured to test individual components. Alternatively, the baseline and/or testing devices 120 and 130 may be production test equipment configured to test a large batches of ICs. Moreover, the baseline and testing devices 120 and 130 may be implemented as separate devices or as a single device configured to operate as both a baseline device and a testing device.

Circuit 150 shows a block diagram of an example circuit that may be used to implement the baseline and/or testing devices 120 and 130 in some various implementations. The circuit 150 includes an EM sensor 156 configured to measure an EM signal emitted by an IC (e.g., 140). A high-resolution ADC 158 is coupled to the EM sensor 156 and is configured to produce a quantized segment of the EM signal measured by the EM sensor 156 in response to a control signal 160. The resolution of the ADC 158 is high enough such that the values of the quantized segment are sensitive to PVT characteristics exhibited by the IC.

The circuit 150 also includes a processing circuit 154 configured to prompt the high-resolution ADC 158 to produce the quantized signature, via the control signal, and determine a signature for the IC from the quantized segment. In some implementations, the processing circuit 154 may perform a statistical analysis to isolate EM signals emitted by the IC 140 from environmental noise in the process of determining a signature from the quantized segment. For example, if the IC performs a repetitive process, the processing circuit may identify cycles of the repetitive process as a repeating pattern in measured EM signals. The processing circuit may compare the identified cycles to identify EM signal patterns common to each of the cycles. The common patterns are identified as the EM noise signal emitted by the IC.

In some implementations, the processing circuit 154 controls the high-resolution ADC 158 to quantize the EM signal while the IC 140 performs a designated process. For instance, the processing circuit 154 may prompt the high-resolution ADC 158 to quantize an EM signal emitted during a boot sequence of the IC 140. In some implementations, the device may be configured to prompt the IC 140 to perform the designated process. For example, the circuit 150 may prompt the IC to perform the designated process by transmitting an command signals to the IC, for example, via an RFID interface. As another example, the circuit 150 may input a predetermined set of data to the IC to cause the IC to perform the designated process.

In this example, the circuit 150 also includes a data storage circuit 152 for storage of determined and/or retrieved signatures in a local database. In some implementations, the processing circuit 154 may be configured to upload determined baseline signatures to a file server, via a network connection, retrieve baseline signatures from a file server for comparison, or both.

The circuit 150 may be adapted to determine baseline signatures for ICs, test ICs for subsequent changes, or both. As one example, the circuit 150 may be configured to determine and store a baseline signature for an IC when operated in a first mode (baseline mode). When operated in a second mode (testing mode), the circuit 150 may test for changes to the IC by determining a current signature for the IC and comparing the current signature to the baseline signature.

Example processes for determining signatures and testing are described with reference to FIGS. 2, 3, and 4. FIG. 2 shows a process for determining a signature of an IC based on EM emissions. At block 202, a testing device is aligned with a designated test position relative to an IC. At block 204, the IC is optionally prompted to perform a designated process. An EM signal emitted by the IC is measured at block 206. At block 208, a segment of the EM signal is quantized using a high-resolution ADC and a signature of the IC is determined from the quantized segment.

FIG. 3 shows a first process for IC verification, in accordance with one or more implementations. At block 302, a baseline signature for the IC is determined using, for example, the process shown in FIG. 2. At block 304, the baseline signature is stored with an identification number of the IC in a database. At a later time at block 306, a second signature for the IC is determined using, for example, the process shown in FIG. 2. At block 308, the baseline signature is retrieved from the database and is compared to the second signature. If the baseline signature does not match the second signature, at decision block 310, the process indicates that a change to the IC is detected at decision block 312. Otherwise, if the baseline signature matches the second signature, the process indicates that the IC is verified at block 314.

Figure 4:
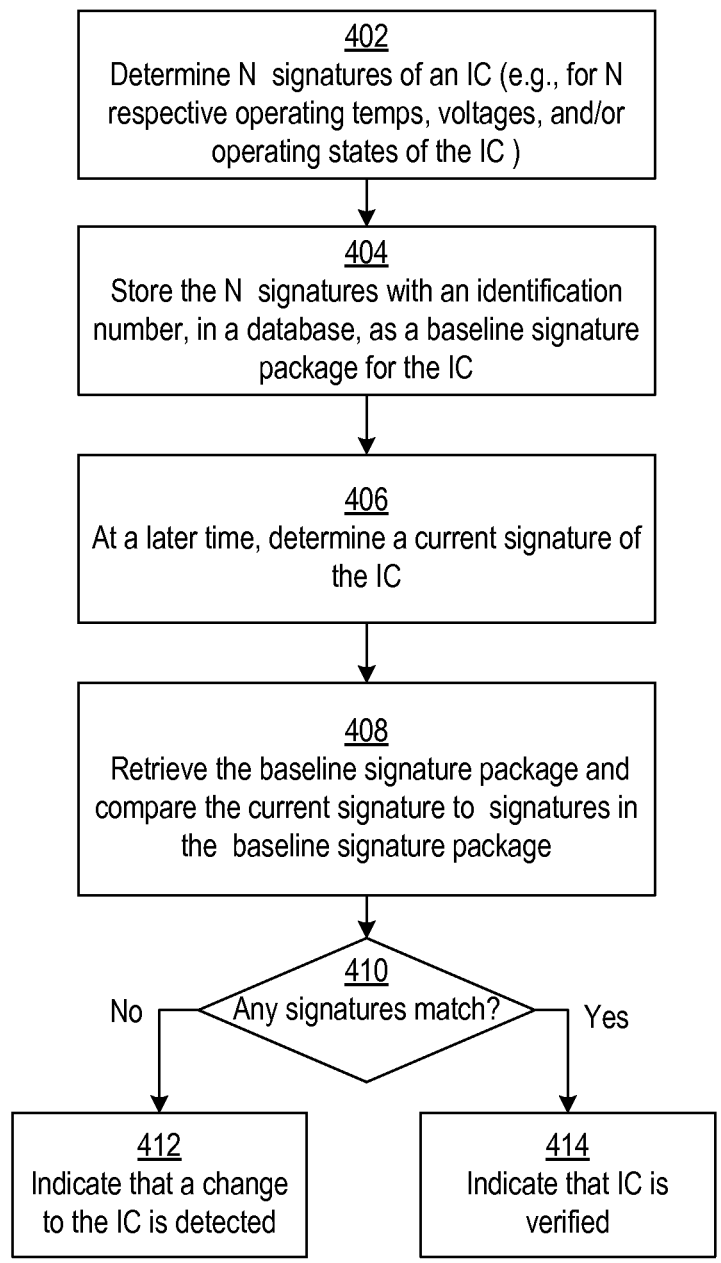
FIG. 4 shows a second process for IC verification, in accordance with one or more implementations.

FIG. 4 shows a second process for IC verification, in accordance with one or more implementations. As previously discussed, some implementations may determine multiple baseline signatures for different operating temperatures/voltages of an IC and/or processing states of an IC. In this example, the process determines N signatures for an IC, at block 402, for N different operating temperatures, voltages, and/or processing states of the IC. At block 404, the N signatures are stored, with an identification number for the IC, as a signature package for the IC in a database. At a later time at block 406, a current signature is determined for the IC. At block 408, the baseline signature package for the IC is retrieved and signatures therein are compared to the current signature. If none of the signatures in the signature package match the current signature, at decision block 410, the process indicates that a change to the IC is detected at decision block 412. Otherwise, if any of the signatures in the signature package matches the current signature, at decision block 410, the process indicates that the IC is verified at block 414.

As previously described, in some implementations, a circuit design may be modified prior to implementation, as an application specific IC (ASIC) or using a programmed programmable IC, to increase emission of EM signals by the IC. Such modification is contrary to conventional design practice. In the conventional design process, a circuit is generally optimized in an attempt to reduce emission of EM signals by an IC. Such optimization is performed to reduce susceptibility to side-channel attacks that analyze EM radiation to deduce implementation details of an IC, such as cryptographic keys used by the IC for encryption/decryption. Using statistical analysis of variations in the EM emitted by an IC, an attacker can identify operations that are performed and determine the cryptographic decryption key(s).

In contrast to the conventional design process, some disclosed implementations, modify a circuit design to increase EM signals that are emitted by the IC. More specifically, a circuit design is modified to increase emissions of EM signals that are characteristic of one or more properties (e.g., PVT) that are unique to the IC. In some implementations, a design tool may be configured to automatically perform various modifications to a hardware description language (HDL) circuit design to increase EM emissions. As one example modification, an HDL circuit design may be modified to replace communication channels using differential signal lines with communication channels using a single-ended signal line. As another example, an HDL circuit design may be modified to reduce the clock rate of one or more circuits. EM signals emitted by an IC may also be increased by removing circuits, which add masking noise, from an HDL circuit design. As yet another example, a design tool may be configured to modify a circuit design to include a circuit that implements a physically unclonable function (PUF). PUFs implement a physical structure that reacts in an unpredictable (but repeatable) way due to the complex interaction of the stimulus with the physical characteristics of the circuit such as PVT. As one example, a PUF circuit may implement a race condition having an outcome that is dependent on PVT characteristics of the PUF circuit. The quality of the EM signal emitted by the PUF circuit can be improve by disabling other circuits during when EM signals are to be measured. The quality of the EM signal can also be improved by disabling simultaneous switching optimization circuits, which spread out switching events over time to avoid spikes in the current consumption and EM emissions.

The disclosed devices, systems, and methods may be adapted to detect changes to ICs in various circuits and applications. Some implementations are thought to be particularly applicable for the detection of unauthorized changes in programmable ICs, which may be modified via a set of configuration data stored in an external non-volatile memory.

Figure 5:
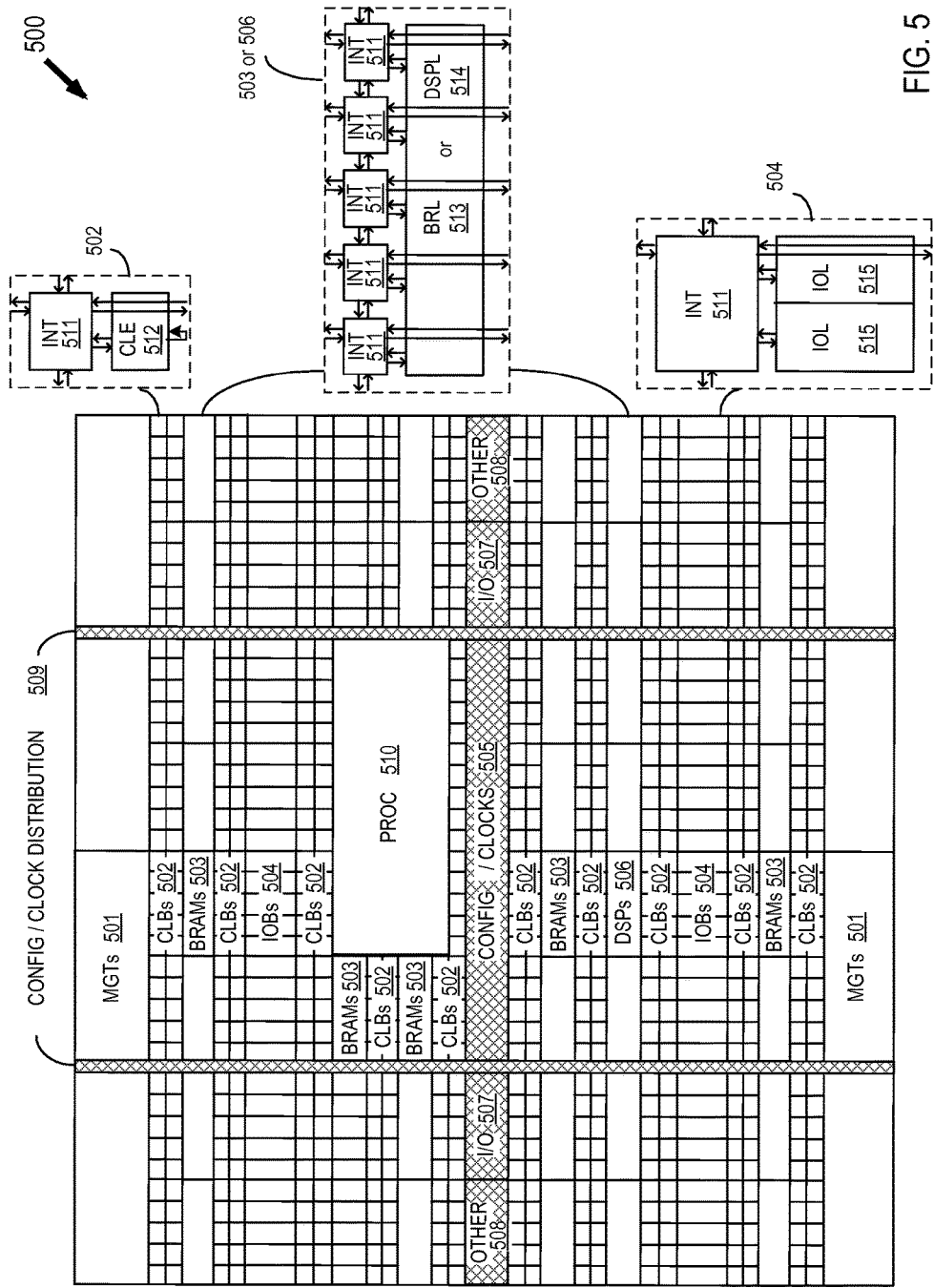
FIG. 5 shows an example programmable IC that may be tested for changes in accordance with one or more embodiments.

FIG. 5 shows a programmable integrated circuit (IC) 500, which may be tested for changes using the disclosed processes and methods. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

The methods, devices and systems are thought to be applicable to a variety of applications using electronic circuits. Other aspects and features will be apparent to those skilled in the art from consideration of the specification. For example, although aspects and features may in some cases be described in individual figures, it will be appreciated that features from one figure can be combined with features of another figure even though the combination is not explicitly shown or explicitly described as a combination. The methods, devices, and systems may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An apparatus for detecting changes to an integrated circuit (IC), comprising:
   an electromagnetic (EM) sensor configured to measure an EM signal emitted by a physically unclonable function (PUF) implemented on the IC while the IC is positioned in a designated location relative to the EM sensor;
   a high-resolution analog-to-digital converter (ADC) coupled to the EM sensor and configured to, responsive to a control signal, produce a quantized segment of the EM signal, wherein the quantized segment of the EM signal is unique to process-voltage-temperature (PVT) characteristics exhibited by the PUF on the IC;
   a data storage circuit configured with one or more baseline signatures determined from the IC; and
   a processing circuit coupled to the high-resolution ADC and the data storage circuit, the processing circuit configured to perform a set of verification operations including:
   prompting the high-resolution ADC, via the control signal, to produce the quantized segment of the EM signal;
   determining a first signature from the quantized segment of the EM signal;
   retrieving at least one of the one or more baseline signatures from the data storage circuit; and
   indicating that a change to the IC is detected in response to the first signature being different from the at least one baseline signature.

2. The apparatus of claim 1, wherein the processing circuit is configured to perform a statistical analysis on the quantized segment of the EM signal to remove environmental noise.

3. The apparatus of claim 1, wherein:
   the processing circuit is further configured to perform the set of verification operations when operated in a testing mode; and
   the processing circuit is further configured to, when operating in a baseline mode, perform a second set of operations including:
   prompting the high-resolution ADC, via the control signal, to produce a second quantized segment of the EM signal;
   determining the at least one baseline signature from the second quantized segment of the EM signal;
   associating the at least one baseline signature with an identification number of the IC; and
   storing the at least one baseline signature and the associated identification number in the data storage circuit.

4. The apparatus of claim 3, wherein the second set of operations further includes uploading the at least one baseline signature and the associated identification number to a database, via a network connection.

5. The apparatus of claim 3, wherein:
   the second set of operations includes, prior to prompting the high-resolution ADC to produce the second quantized segment of the EM signal, prompting the IC to perform a designated process; and
   the set of verification operations includes, prior to prompting the high-resolution ADC to produce the quantized segment of the EM signal, prompting the IC to perform the designated process.

6. The apparatus of claim 5, wherein prompting the IC to perform the designated process includes transmitting a control signal to the IC via an RFID interface.

7. The apparatus of claim 5, wherein prompting the IC to perform the designated process includes providing a set of data values to respective inputs of the IC.

8. The apparatus of claim 3, wherein the processing circuit is configured to prompt the high-resolution ADC to produce the quantized segment of the EM signal during a boot sequence of the IC.

9. The apparatus of claim 1, further comprising an alignment indicator configured to align with an alignment marker on the IC when the EM sensor is positioned in a designated testing location relative to the IC.

10. A method for detecting changes to an integrated circuit (IC), comprising:
    positioning the IC in designated testing location relative an electromagnetic (EM) sensor;
    measuring a segment of an EM signal emitted by a physically unclonable function (PUF) implemented on the IC;
    quantizing the segment of the EM signal using a high-resolution analog-to-digital converter (ADC) to produce a quantized segment of the EM signal which is unique to process-voltage-temperature (PVT) characteristics exhibited by the PUF on the IC;
    determining a first signature from the quantized segment of the EM signal;
    retrieving at least one of one or more baseline signatures previously determined from the IC from a database; and
    in response to the first signature being different from the at least one baseline signature, indicating that a change to the IC is detected.

11. The method of claim 10, further comprising:
    prior to the measuring a segment of the EM signal emitted by the IC, measuring a previous segment of the EM signal emitted by the IC;
    quantizing the previous segment of the EM signal using the high-resolution ADC to produce a second quantized segment of the EM signal which is unique to the PVT characteristics exhibited by the IC;
    determining the at least one baseline signature from the second quantized segment of the EM signal; and
    storing the at least one baseline signature in the database.

12. The method of claim 11, further comprising associating the at least one baseline signature with an identification number of the IC, wherein the storing the at least one baseline signature stores the identification number with the at least one baseline signature in the database.

13. The method of claim 11, further comprising prior to measuring each of the segments of the EM signal, prompting the IC to perform a designated process.

14. The method of claim 13, wherein prompting the IC to perform the designated process includes transmitting a control signal to the IC via an RFID interface.

15. The method of claim 13, wherein prompting the IC to perform the designated process includes providing a set of data values to respective inputs of the IC.

16. The method of claim 10, wherein the measuring the segment of the EM signal is performed during a boot sequence of the IC.

17. The method of claim 10, further comprising performing a statistical analysis on the quantized segment of the EM signal to remove environmental noise.

18. The method of claim 10, wherein the IC is a programmable IC and further comprising:

supplementing a hardware descriptive language (HDL) user design to include a physically-uncloneable-function; and programming the programmable IC to implement the HDL user design.

19. The method of claim 18, further comprising modifying the HDL user design to increase emission of the EM signal by the programmable IC.

20. A system comprising:

a database;

a first device configured to:
- determine a baseline signature for an integrated circuit (IC) from an electromagnetic (EM) signal emitted by a physically unclonable function (PUF) implemented on the IC, the baseline signature being unique to process-voltage-temperature (PVT) characteristics exhibited by the PUF on the IC positioned in a designated location relative to an EM sensor; and
- upload the baseline signature to the database and associate the baseline signature with an identification number in the database; and a second device configured to:
- determine a second signature for the IC, the second signature being unique to PVT characteristics exhibited by the IC positioned in a designated location relative to an EM sensor;
- retrieve the baseline signature from the database using the identification number of the IC; and
- in response to the second signature being different from the baseline signature, indicating that a change to the IC is detected.

* * * * *